US007610030B2

(12) United States Patent
Fitzgibbon et al.

(10) Patent No.: US 7,610,030 B2
(45) Date of Patent: Oct. 27, 2009

(54) WIRELESS TRANSMIT-ONLY APPARATUS AND METHOD

(75) Inventors: James J. Fitzgibbon, Batavia, IL (US); Robert Roy Keller, Jr., Chicago, IL (US); Bernard J. Wojciak, Naperville, IL (US)

(73) Assignee: The Chamberlain Group, Inc., Elmhurst, IL (US)

( * ) Notice: Subject to any disclaimer, the term of this patent is extended or adjusted under 35 U.S.C. 154(b) by 377 days.

(21) Appl. No.: 11/555,024

(22) Filed: Oct. 31, 2006

(65) Prior Publication Data

US 2007/0054644 A1    Mar. 8, 2007

Related U.S. Application Data

(63) Continuation of application No. 10/645,318, filed on Aug. 21, 2003, now Pat. No. 7,181,174.

(51) Int. Cl.
*H04B 1/06* (2006.01)

(52) U.S. Cl. .......................... 455/260; 455/91; 455/95; 455/265; 455/180.3; 375/376; 340/825.2; 340/825.69; 340/825.72

(58) Field of Classification Search .................. 455/91, 455/95, 260, 265, 180.3; 375/376; 340/825, 340/825.69, 825.722
See application file for complete search history.

(56) References Cited

U.S. PATENT DOCUMENTS

| 3,576,482 | A | 4/1971 | Rhee |
| 3,869,671 | A | 3/1975 | Schroder |
| 4,021,756 | A | 5/1977 | Podowski et al. |
| 4,706,727 | A | 11/1987 | Leivenzon et al. |
| 4,794,622 | A | 12/1988 | Isaacman et al. |
| 5,222,327 | A | 6/1993 | Fellows et al. |
| 5,334,876 | A | 8/1994 | Washeleski et al. |
| 5,335,307 | A | 8/1994 | Sommer |
| 5,557,887 | A | 9/1996 | Fellows et al. |
| 5,564,101 | A | 10/1996 | Eisfeld et al. |
| 6,005,508 | A | 12/1999 | Tsui |

(Continued)

FOREIGN PATENT DOCUMENTS

| DE | 10226294 A1 | 12/2003 |
| GB | 2300944 | 11/1996 |
| GB | 2300945 | 11/1996 |
| GB | 2300997 | 11/1996 |
| GB | 2301961 A | 12/1996 |
| JP | 404046494 A | 2/1992 |
| WO | WO 03/051085 | 12/1996 |

OTHER PUBLICATIONS

British Search Report from corresponding application GB 04 186 35.9 dated Nov. 26, 2004.
International Search Report, dated Aug. 27, 2004, in PCT application PCT/US04/01157.

*Primary Examiner*—Sanh D Phu
(74) *Attorney, Agent, or Firm*—Fitch Even Tabin & Flannery

(57) ABSTRACT

A wireless transmit-only apparatus (20) has a controller (21) that responds to a user interface 25 by correlating specific user input with a corresponding characterizing transmission parameter(s) as is stored in a memory (35) and by selecting a corresponding resonant device (31 and 32). The latter devices serve to drive the PLL control input of a phase locked loop (23) to thereby influence the transmission carrier frequency of a wireless transmitter (22). In a preferred embodiment, at least one of the resonant devices comprises a mechanically resonant device such as a surface acoustic wave device, a crystal resonator, or a ceramic resonator.

12 Claims, 4 Drawing Sheets

U.S. PATENT DOCUMENTS

| | | |
|---|---|---|
| 6,014,307 A | 1/2000 | Crimmins |
| 6,137,255 A | 10/2000 | Skalski |
| 6,137,421 A * | 10/2000 | Dykema ................ 340/825.69 |
| 6,172,475 B1 | 1/2001 | Fitzgibbon et al. |
| 6,326,751 B1 | 12/2001 | Mullet et al. |
| 6,356,082 B1 | 3/2002 | Alkire et al. |
| 6,486,795 B1 | 11/2002 | Sobel et al. |
| 6,766,178 B1 * | 7/2004 | Damgaard et al. ....... 455/552.1 |
| 6,822,603 B1 | 11/2004 | Crimmins et al. |
| 6,952,087 B2 | 10/2005 | Lamm |
| 7,174,137 B2 | 2/2007 | Fitzgibbon et al. |
| 7,181,174 B2 | 2/2007 | Fitzgibbon et al. |
| 7,205,735 B2 | 4/2007 | Keller, Jr. |
| 2003/0073417 A1 | 4/2003 | Nantz et al. |
| 2004/0207537 A1 | 10/2004 | Keller, Jr. et al. |
| 2005/0012488 A1 | 1/2005 | Fitzgibbon et al. |

* cited by examiner

WIRELESS TRANSMIT-ONLY APPARATUS AND METHOD

RELATED APPLICATIONS

The present application is a continuation of, and claims priority to, U.S. patent application Ser. No. 10/645,318 (titled "Wireless Transmit-Only Apparatus and Method," filed on Aug. 21, 2003, invented by the same inventors, and assigned to the same assignee, as the present invention), the disclosure of which is incorporated herein.

TECHNICAL FIELD

This invention relates generally to wireless transmit-only devices and more particularly to frequency agile transmitters.

BACKGROUND

Wireless transmitters of various kinds are known in the art. Some transmitters comprise a transceiver that can both transmit and receive information in order to facilitate, for example, programming. Other devices only support transmission. For example, remote control devices as used with movable barrier operators are often transmit-only devices.

In general, prior art transmit-only devices of this sort utilize a single transmission frequency. In fact, some manufacturers differentiate their products from their competitors by utilizing remote control signaling transmitters that operate on a frequency that is different from their competitors.

In more recent time, however, steps have been taken to permit greater compatibility as between the devices that are provided by different manufacturers. For example, there are movable barrier operators that can compatibly receive the transmissions of devices from various manufacturers. In particular, such operators have frequency-agile receivers that can receive the transmissions from a plurality of transmitters that use differing transmission frequencies.

In a similar manner, so-called universal transmitters have been proposed that can transmit remote control signals as correspond to the transmission frequencies of a plurality of differing systems. Such transmitters can therefore operate compatibly with a variety of movable barrier operators and therefore potentially provide greater convenience to a user. For example, a person owning a home having a garage that utilizes a first movable barrier operator system and a weekend cottage having a garage that utilizes a second movable barrier operator system can utilize a single remote control transmitter to operator both notwithstanding that the two systems might otherwise be incompatible with one another.

Such universal transmitters have not met with significant commercial success in all respects, however. There may be any number of causes associated with this circumstance, but cost appears to be at least one significant contributor. In particular, the frequency agility requirements of such a transmitter represents a considerable incremental cost increase. Such incremental cost in turn may represent an impediment to more widespread utilization and acceptance.

BRIEF DESCRIPTION OF THE DRAWINGS

The above needs are at least partially met through provision of the wireless transmit-only apparatus and method described in the following detailed description, particularly when studied in conjunction with the drawings, wherein.

Figure 2:
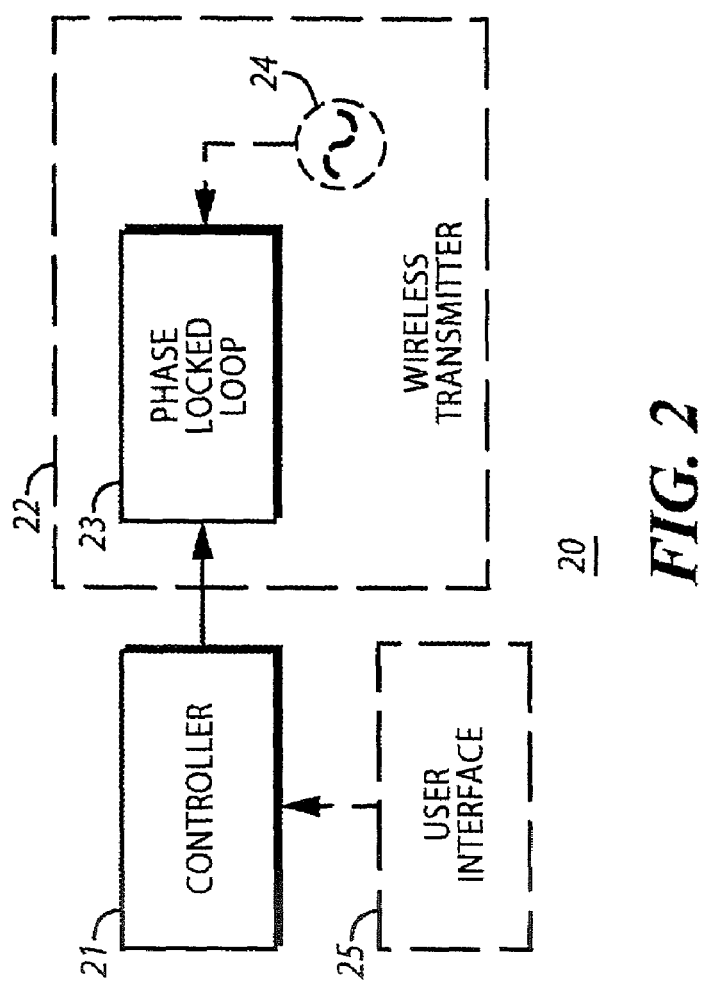
FIG. 2 comprises a block diagram as configured in accordance with various embodiments of the invention.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are typically not depicted in order to facilitate a less obstructed view of these various embodiments of the present invention.

DETAILED DESCRIPTION

Generally speaking, pursuant to these various embodiments, a wireless transmit-only apparatus, such as a remote control transmitter for a movable barrier operator, comprises a controller having a transmission frequency selection output and a wireless transmitter having a phase locked loop that is responsive to the transmission frequency selection output. In a preferred embodiment, the resultant wireless transmit-only apparatus can selectively transmit at a plurality of different frequencies as selected by the controller and effected, at least in part, by the phase locked loop. So configured, the apparatus can accommodate differing transmission frequencies as characterize the protocols and requirements of differing manufacturers and systems. This capability in turn permits provision of a cost-effective yet simple-to-use transmitter that can work compatibly and relatively transparently with a variety of different movable barrier operators.

Pursuant to one embodiment, the phase locked loop has a programmable divider input that operably couples to an oscillator, which oscillator is, in turn, controlled by the controller. Such "programmability" can include, for example, but is not limited to, selection of one from amongst many possible divider inputs. This configuration permits a relatively cost efficient mechanism to provide the transmitter with a desired level of frequency agility.

Pursuant to another embodiment, the phase locked loop has a PLL control input that operably couples to a plurality of selectively switchable resonant devices. In a preferred embodiment, at least one of the resonant devices comprises a mechanically resonant device and in one embodiment, all of the resonant devices comprise mechanically resonant devices. These mechanically resonant devices can be any suitable mechanically resonant devices as are presently known or hereafter developed, including but not limited to crystal resonators, ceramic resonators, and surface acoustic wave devices. When a plurality of mechanically resonant devices are provided, they can all be of a same class of resonant device (for example, they can all be crystal resonators) or they can include resonant devices from differing classes of device.

Pursuant to one embodiment, the PLL control input of the phase locked loop operably couples to a single oscillator
} circuit. The single oscillator circuit, in turn, switchably couples to a plurality of resonant devices. So configured, the controller selects a particular one of the plurality of resonant devices to operate in conjunction with the oscillator to thereby control the PLL control control input to the phase locked loop. This, in turn, permits control of the oscillation frequency of the oscillator circuit. A transmitter then utilizes this resultant oscillation frequency to influence the transmission carrier frequency utilized to transmit a message.

Pursuant to another embodiment, the PLL control input of the phase locked loop switchably couples to a plurality of oscillator circuits. Each oscillator circuit has a corresponding resonant device wherein preferably each resultant oscillator circuit will produce a selectively different output oscillation frequency. By controlling which oscillator circuit is operably coupled to the PLL control input of the phase locked loop, the controller is again able to influence the transmission carrier frequency of a corresponding transmitter.

So configured, a transmitter can be imbued with frequency agility at a considerably reduced cost as compared to prior art efforts in this regard. This economy results in part through the relatively low cost of virtually all the incremental components required to support such frequency agility. Such an approach also lends itself well to relatively high levels of integration, thereby further contributing to minimized cost and a compact form factor that is relatively friendly to a wide variety of potential applications.

Figure 1:
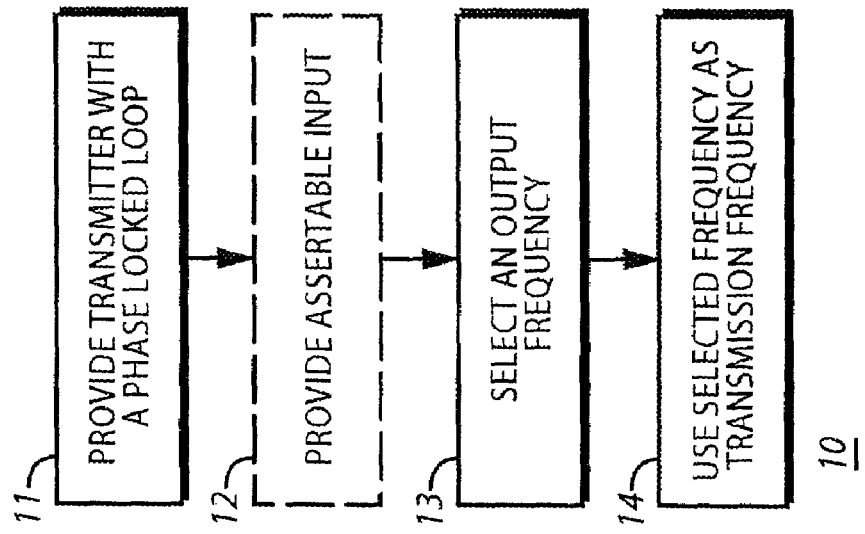
FIG. 1 comprises a flow diagram as configured in accordance with various embodiments of the invention.

Referring now to the drawings, and in particular to FIG. 1, a process 10 provides 11 a transmitter with a phase locked loop, selects 13 an output frequency, and uses 14 that selected frequency as a transmission frequency.

Pursuant to a preferred approach, when providing 11 the transmitter with a phase locked loop, the phase locked loop will support provision of a plurality of selectable output frequencies. By one approach, this phase locked loop will have a programmable divider value that is responsive to one or more control signals from a controller. By another approach, this phase locked loop has a PLL control input. Both mechanisms are well understood in the art and hence further description will not be provided here for the sake of brevity and the preservation of focus.

To facilitate selection 13 of an output frequency, optionally, the process 10 can provide 12 for an assertable input. This assertable input can comprise a single assertable input but will comprise, in a preferred approach, a plurality of assertable user inputs. Selection 13 of an output frequency can then be based, at least in part, upon assertion of a given corresponding assertable input. For example, upon detecting assertion of a particular assertable input the process 10 can facilitate selecting one of a plurality of selectable output frequencies as a function thereof.

Selecting 13 an output frequency can comprise selecting one of a plurality of resonant elements to operably couple to the PLL control input (where again, the plurality of resonant elements can comprise a least one and preferably at least a plurality of mechanically resonant devices). Depending upon the embodiment, this selection of a resonant element can comprise selection of a particular resonant element to use in conjunction with an oscillator or can comprise selection of one oscillator of many wherein each oscillator has at least one corresponding resonant element associated therewith.

In accordance with well understood prior art technique, the output of the phase locked loop can then be used 14 to govern the frequency at which a corresponding transmitter transmits a desired message (such as, for example, a remote control instruction to a movable barrier operator to command the latter to initiate movement of a corresponding movable barrier).

Such a process can be implemented in a variety of ways. Pursuant to one approach, and referring now to FIG. 2, a transmit-only apparatus 20 can be comprised of a controller 21 that operably couples to a wireless transmitter 22 and in particular to a phase locked loop 23 that comprises a part thereof or that otherwise operates in conjunction therewith.

In a preferred embodiment the controller 21 comprises a programmable platform (such as a microprocessor, a microcontroller, a programmable gate array, or the like). As well understood in the art, such a programmable platform can be realized through use of a single integrated platform or the requisite functionality can be distributed over a plurality of supporting platforms in accordance with the needs, requirements, and resources as may apply with respect to a given application. In the alternative, if desired, the controller 21 can comprise an essentially non-programmable platform that serves only the specific functionality set forth herein. Such architectural options are understood in the art and further elaboration here will not be presented for the sake of brevity.

The controller 21 serves, at least in part, to facilitate selection of a particular output frequency (from amongst a plurality of available output frequencies) that the phase locked loop 23 will provide. Pursuant to one approach, the controller 21 can select a particular programmable divide value for the phase locked loop to thereby effect such selection. Pursuant to another approach, the controller 21 can select an input oscillation signal as is applied to a PLL control input of the phase locked loop 23 by an oscillator 24. As will be illustrated below in more detail, this can be facilitated in a variety of ways, including by selecting from amongst a plurality of resonant devices to use in conjunction with a single oscillator circuit and by selecting from amongst a plurality of oscillator circuits that each have a corresponding (and preferably differing) resonant device.

Pursuant to one embodiment, the controller 21 selects a particular resonant device as a function, at least in part, of a user interface 25 that is operably coupled to the controller 21. In a preferred approach, this user interface 25 comprises at least one independently assertable input.

Figure 3:
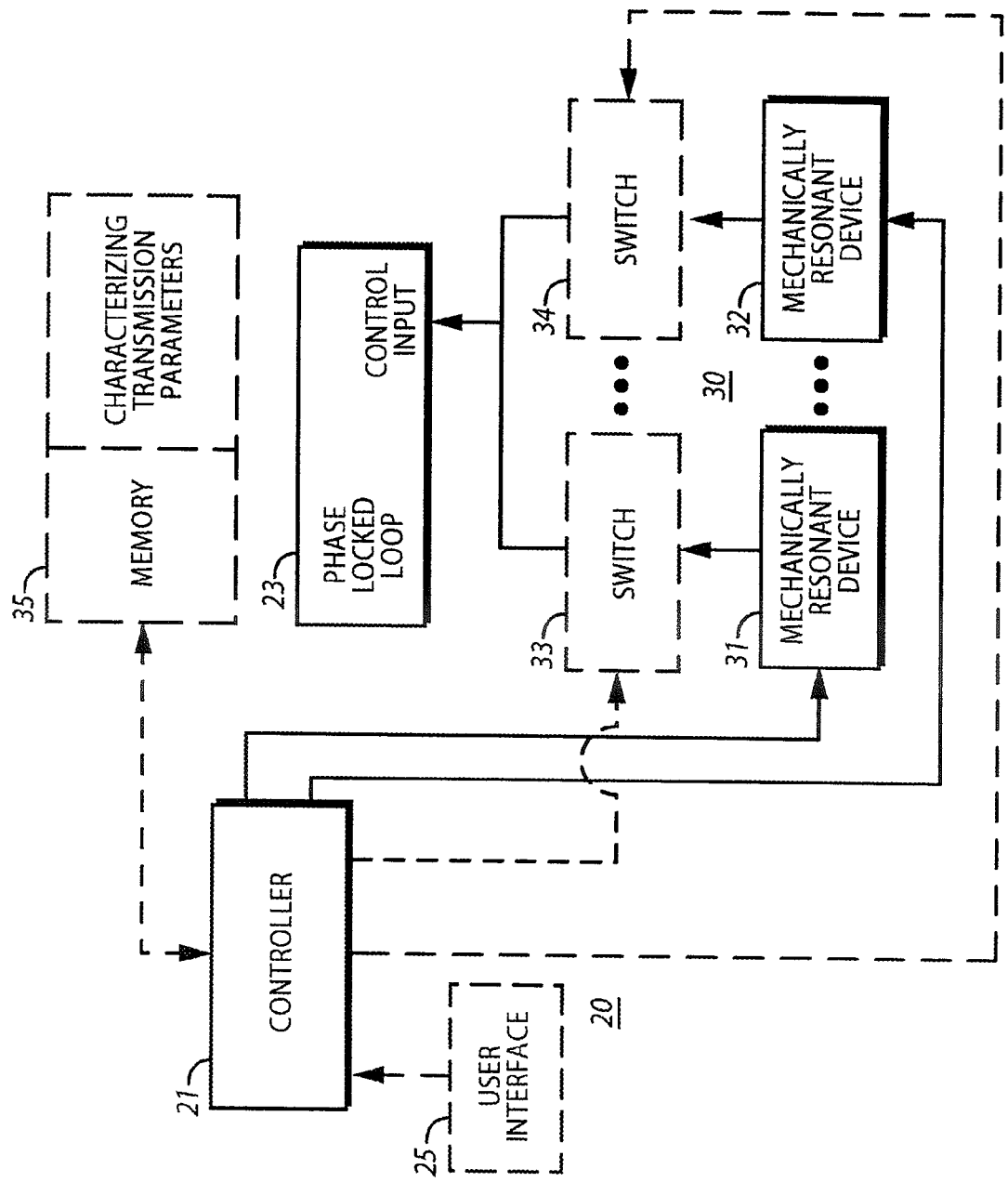
FIG. 3 comprises a block diagram as configured in accordance with various embodiments of the invention.

Referring now to FIG. 3, a more detailed representation of a more specific embodiment of a wireless transmit-only apparatus 20 provides a plurality of mechanically resonant devices 31 and 32 that are each operably responsive to the controller 21. (Although only two such mechanically resonant devices are depicted in FIG. 3, it will be understood that any number of such devices in excess of one can be provided as appropriate to the needs of a given application). These mechanically resonant devices can be, for example, any of a crystal resonator, a ceramic resonator, a surface acoustic wave device, or the like as appropriate to the needs of a given application. Each mechanically resonant device 31 and 32 in turn is operably coupled to a PLL control input of the phase locked loop 23 (for example, pursuant to one embodiment, the PLL control input can comprise a the set divider input with other examples being available as well). So configured, the controller 21 can select which of the mechanically resonant devices 31 and 32 is utilized in conjunction with the phase locked loop 23 to influence the frequency of an output signal as provided thereby.

Figure 4:
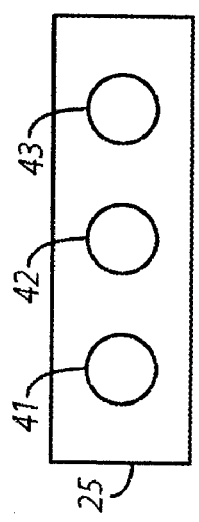
FIG. 4 comprises a detail view as configured in accordance with an embodiment of the invention.

As noted earlier, the controller 21 can base its selection of a particular one of the mechanically resonant devices 31 and 32 as a function, at least in part, of the user interface 25. For example, and referring momentarily to FIG. 4, the user interface 25 can be comprised of a plurality of independently assertable inputs. In a preferred embodiment, there are three such independently assertable inputs 41, 42, and 43 provided. Any known or hereafter developed mechanism can be utilized to effect this need as appropriate to the requirements of a given design. In one embodiment, for example, each independently assertable input can be realized through provision of a push-button switch. It would also be possible to provide a variety of different assertable input form factors in a single embodiment to suit, for example, the needs of a given application.

In a preferred embodiment, the controller 21 is also operably coupled to a memory 35 (which memory 35 can be remote with respect to the controller 21 or integral thereto and/or which can be comprised of a single platform as illustrated or can be comprised of a plurality of memory platforms, all as well understood in the art). This memory 35 serves, at least in part, to retain a plurality of characterizing transmission parameters. Such transmission parameters can include specifics that pertain to a given signaling, transmission, and/or control protocol as per the dictates of a corresponding given operating system paradigm. To illustrate, the data frame structure can vary from transmission message to transmission message to reflect such differing requirements. Accordingly, the memory 35 can include a corresponding characterizing transmission parameter in this regard; i.e., information regarding the data frame structure to be utilized when transmitting a given transmission message. Other examples of possibly relevant characterizing transmission parameters include, but are not limited to, a particular operational code, and a rolling code value and/or an algorithm to facilitate calculation of a next code to transmit (for use with a movable barrier operator that makes use of so-called rolling codes as is otherwise well understood in the art), to name a few.

So configured, the controller 21 can correlate a given independently assertable input not only with a specific one of the mechanically resonant devices, but also with a corresponding one (or more) of the plurality of characterizing transmission parameters. As a result, assertion of a given one of the independently assertable inputs will result in selection of both a particular one of the resonant devices and one or more characterizing transmission parameters. These selected components and constraints can then be utilized to effect the transmission of a compliant message. In a preferred embodiment, such characterizing transmission parameters comprise, at least in part, one or more remote control commands such that each of a plurality of assertable user inputs will correlate with a corresponding remote control command and a corresponding transmission frequency. Fully compatible operation with a plurality of varying systems can be achieved in this way.

In the embodiment described, each of the mechanically resonant devices 31 and 32 is responsive to a control signal from the controller 21. This, in turn, permits the controller 21 to select which of the mechanically resonant devices is active and/or otherwise operatively coupled to the PLL control input of the phase locked loop 23. Pursuant to another approach, and as illustrated with phantom lines, each mechanically resonant device 31 and 32 can operably couple to the PLL control input of the phase locked loop 23 via an intervening switch 33 and 34. By configuring each such switch 33 and 34 to be responsive to the controller 21, the controller 21 can again select which of the mechanically resonant devices 31 and 32 is operably coupled to the PLL control input of the phase locked loop 23 at any given moment. Such switches 33 and 34 can be any of a wide variety of switches as are presently known or hereafter developed; present examples include but are not limited to a transistor, a pin diode circuit, and a relay, to name a few.

Figure 5:
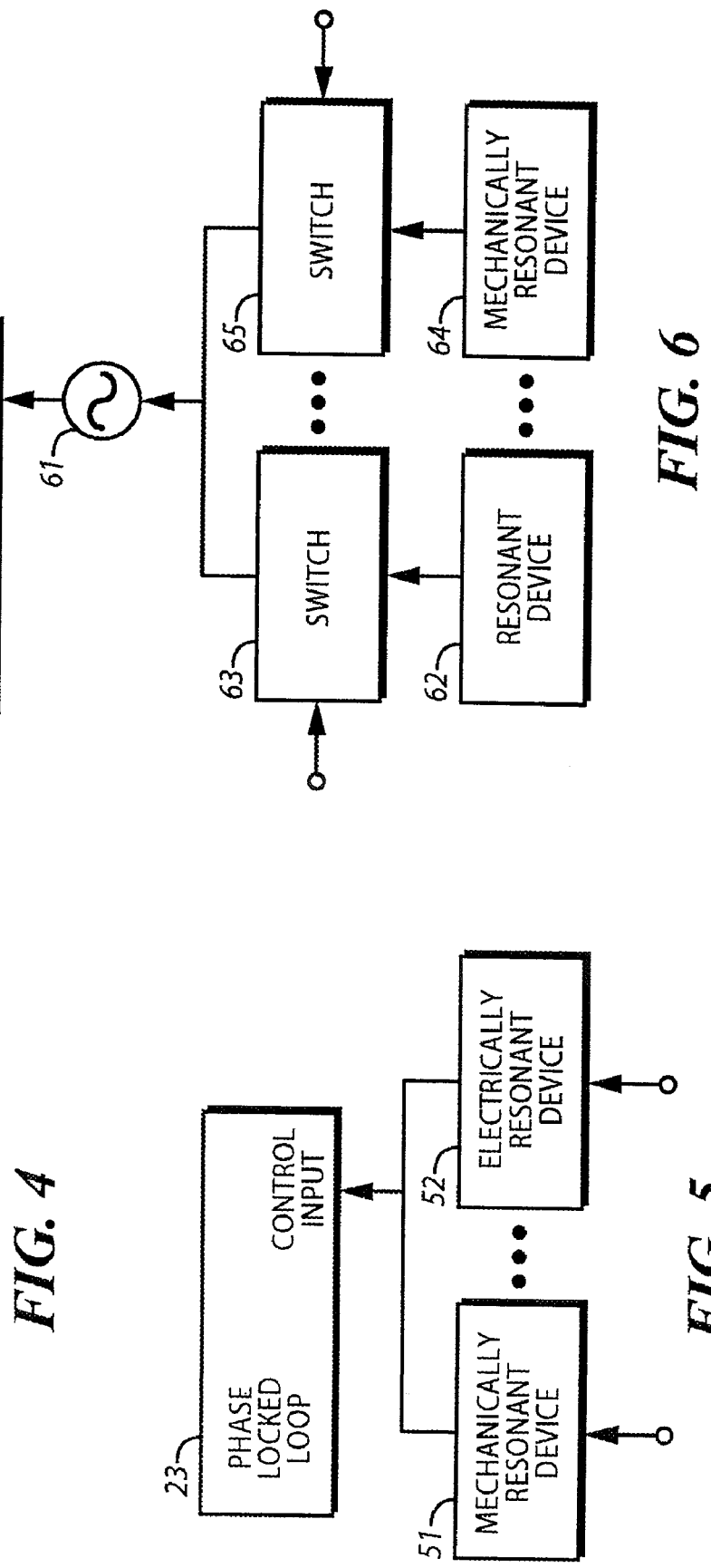
FIG. 5 comprises a detail block diagram as configured in accordance with another embodiment of the invention.

In the illustrative example just provided, each of the resonant devices comprises a mechanically resonant device. Although this represents a preferred approach, there may be times when one or more electrically resonant devices may be successfully employed. To illustrate this point, and referring now to FIG. 5, the PLL control input of a phase locked loop 23 can be selectively coupled to a plurality of resonant devices that include at least one mechanically resonant device 51 and at least one electrically resonant device 52. As depicted, each of these resonant devices 51 and 52 can be made responsive to a control signal from the controller (not shown). Or, if desired and as described above, switches can be utilized to control which of these resonant devices is coupled to the set divided input of the phase locked loop 23.

Figure 6:
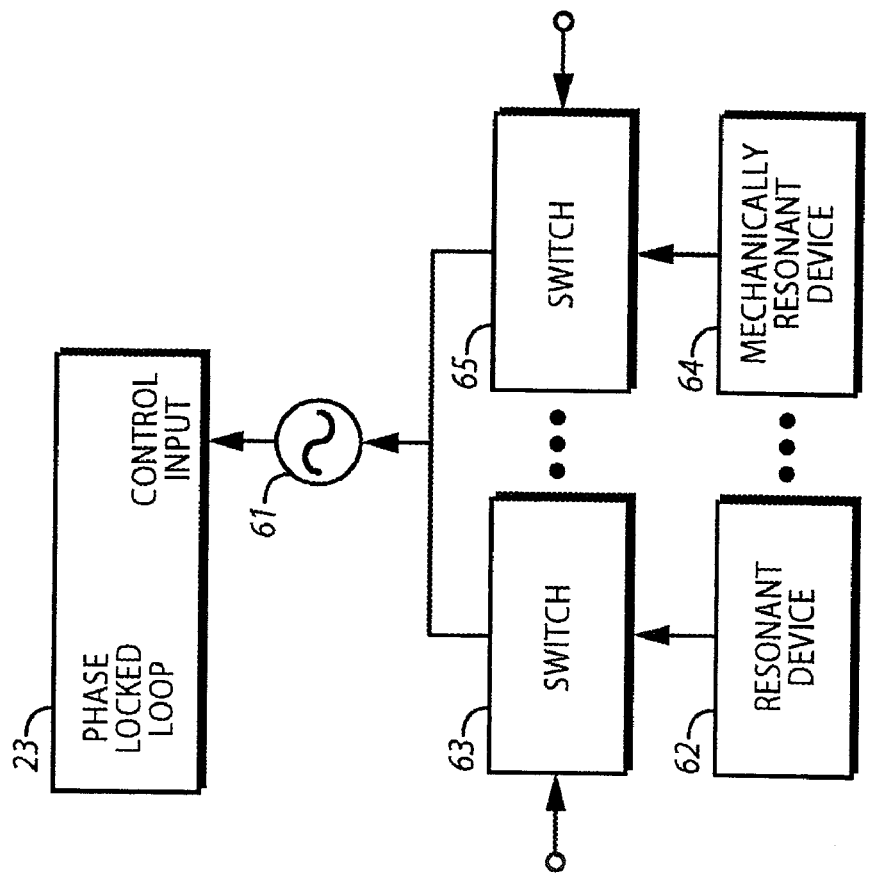
FIG. 6 comprises a detail block diagram as configured in accordance with yet another embodiment of the invention.

In general, the resonant devices of these embodiments will work best to properly influence the PLL control input of a phase locked loop 23 when used in conjunction with an oscillator circuit. For example, and referring now to FIG. 6, an oscillator 61 can be coupled to the PLL control input of the phase locked loop 23. The oscillator 61 itself can then couple via in-line switches 63 and 65 to corresponding resonant devices 62 and 64. (Again, only two such resonant devices are shown in this illustration with it being understood that any number of resonant devices can be made available in this fashion as appropriate to meet the requirements of a given application.) So configured, each switch 63 and 65 can be made responsive to the controller (not shown) to thereby permit the controller to control the closed or open state of each switch and hence which of the resonant devices is coupled to the oscillator 61.

Figure 7:
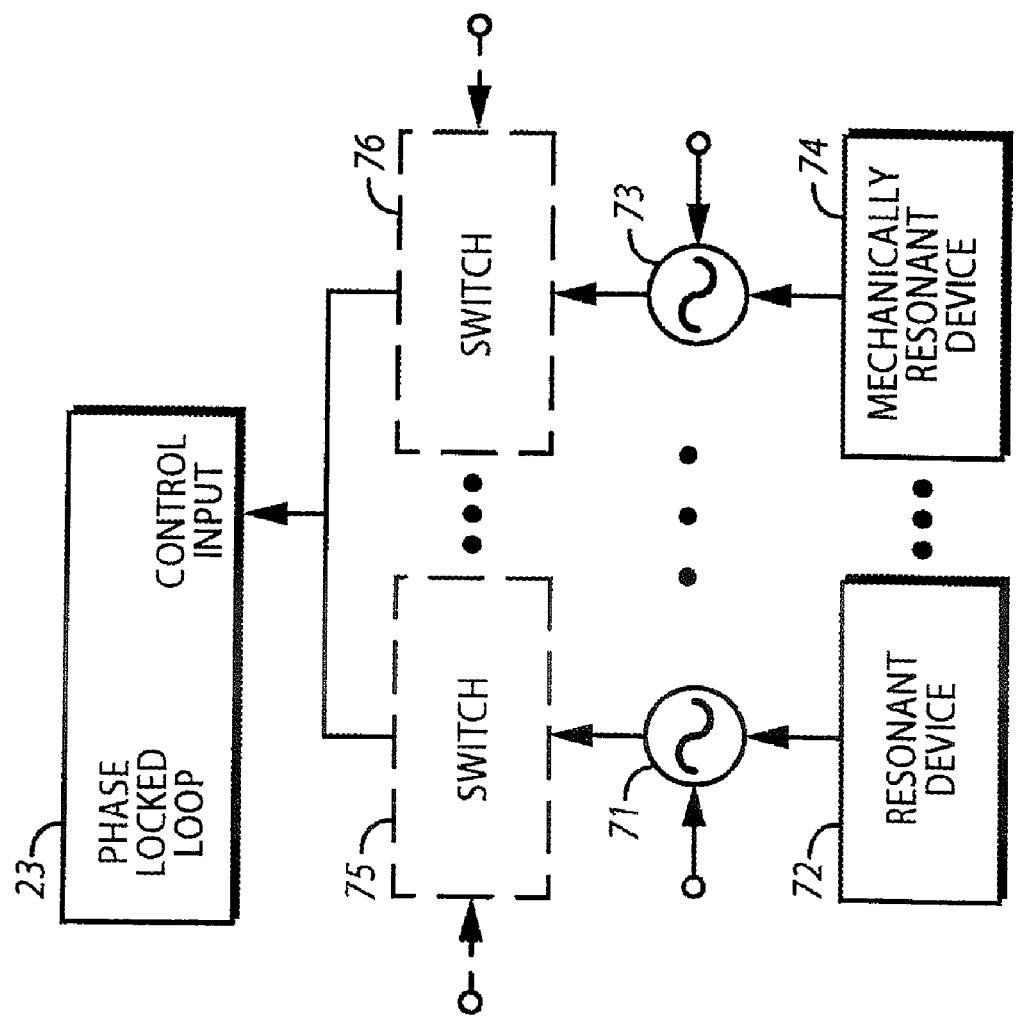
FIG. 7 comprises a detail block diagram as configured in accordance with yet another embodiment of the invention.

In the embodiment just described, a single oscillator works in conjunction with a plurality of resonant devices to provide the requisite oscillating input to the PLL control input of the phase locked loop 23. Pursuant to another approach, and referring now to FIG. 7, a plurality of oscillators 71 and 73 can be utilized where each oscillator 71 and 73 has a corresponding resonant device 72 and 74. In a preferred approach, the oscillators can be essentially identical to one another such that the resultant oscillator output will have a frequency that varies one from the other as a function largely of the resonant frequency of the corresponding resonant device.

These embodiments can be utilized to realize an effective, yet form-factor friendly and economically viable transmit-only apparatus. For example, a movable barrier operator remote control transmitter can be comprised of at least one assertable user input, a memory containing a plurality of remote control commands for a plurality of different movable barrier operators (wherein at least some of the remote control commands comprise a corresponding transmission frequency that is different from other of the remote control commands), and correlation data that correlates the assertable user input(s) with corresponding remote control commands and hence with a corresponding transmission frequency. So configured, a controller that is operably coupled to the assertable user input, the memory, and the correlation data and having a transmission frequency selection output can effectively control the transmission frequency and the message format/content of an operably coupled wireless transmitter having frequency agility owing to a selectively-variable output frequency phase locked loop.

Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept. For example, an embodiment could be provided wherein a plurality of oscillators are available to be individually coupled to the set divide input of a phase locked loop, wherein at least one of the plurality of oscillators itself has a plurality of switchably connectable resonant devices that can be selected for use therewith.

We claim:

1. A wireless transmit-only apparatus comprising:
   a controller having a transmission frequency selection output; and
   a wireless transmitter having a phase locked loop, which phase locked loop is responsive to the transmission frequency selection output;

wherein:
the wireless transmit-only apparatus can selectively transmit at a plurality of different frequencies as selected by the controller and effected, at least in part, by the phase locked loop; and
the phase locked loop has a PLL control input that operably couples to a plurality of selectively switchable mechanically resonant devices.

2. The wireless transmit-only apparatus of claim 1, further comprising a switch for each of the selectively switchable mechanically resonant devices, wherein each such switch is responsive to the transmission frequency selection output of the controller such that the controller can select a particular mechanically resonant device to use with the phase locked loop by controlling each of the switches.

3. The wireless transmit-only apparatus of claim 1, wherein at least one of the plurality of selectively switchable mechanically resonant devices comprises at least one of:
a crystal resonator;
a ceramic resonator; and
a surface acoustic wave device.

4. A wireless transmit-only apparatus comprising:
a controller having a transmission frequency selection output; and
a wireless transmitter having a phase locked loop, which phase locked loop is responsive to the transmission frequency selection output;
wherein:
the wireless transmit-only apparatus can selectively transmit at a plurality of different frequencies as selected by the controller and effected, at least in part, by the phase locked loop;
the wireless transmit-only apparatus further comprises a user interface comprising at least one independently assertable input and wherein the controller is operably responsive to the at least one independently assertable input;
the user interface comprises a plurality of independently assertable inputs and wherein the controller is operably responsive to the plurality of independently assertable inputs; and
the phase locked loop has a PLL control input that operably couples to a plurality of selectively switchable mechanically resonant devices.

5. The wireless transmit-only apparatus of claim 4, further comprising a memory operably coupled to the controller and containing a plurality of characterizing transmission parameters wherein at least some of the plurality of characterizing transmission parameters correspond to particular ones of the plurality of selectively switchable mechanically resonant devices.

6. The wireless transmit-only apparatus of claim 5, further comprising correlation data that correlates at least one of the plurality of independently assertable inputs with a corresponding one of the plurality of characterizing transmission parameters that corresponds to a particular one of the plurality of selectively switchable mechanically resonant devices, such that assertion of a given one of the independently assertable inputs will result in selection of a particular corresponding one of the plurality of mechanically resonant devices for use when transmitting.

7. A wireless transmit-only apparatus comprising:
a controller having a transmission frequency selection output; and
a wireless transmitter having a phase locked loop, which phase locked loop is responsive to the transmission frequency selection output;
wherein:
the wireless transmit-only apparatus can selectively transmit at a plurality of different frequencies as selected by the controller and effected, at least in part, by the phase locked loop;
the controller comprises control means for selecting a particular output frequency, from a plurality of available output frequencies, that the phase locked loop will provide;
the control means is further for selecting a particular resonant circuit from amongst a plurality of candidate resonant circuits to couple to a set divide input of the phase locked loop; and
the plurality of candidate resonant circuits comprise a plurality of mechanically resonant devices.

8. The wireless transmit-only apparatus of claim 7, wherein the plurality of mechanically resonant devices include at least one of:
a crystal resonator;
a ceramic resonator; and
a surface acoustic wave device.

9. The wireless transmit-only apparatus of claim 7, wherein the plurality of candidate resonant circuits comprise a least one mechanically resonant device and at least one electrically resonant circuit.

10. A method of selecting a transmission frequency for a transmit-only wireless apparatus, comprising:
providing a transmitter having a phase locked loop that has a plurality of selectable output frequencies;
selecting one of the plurality of selectable output frequencies to provide a selected frequency; and
using the selected frequency as the transmission frequency for the transmit-only wireless apparatus;
wherein:
the method further comprises providing a transmitter having a phase locked loop that has a plurality of selectable output frequencies comprises providing a transmitter having a phase locked loop having a PLL control input;
selecting one of the plurality of selectable output frequencies to provide a selected frequency comprises selecting one of a plurality of resonant elements to operably couple to the PLL control input; and
selecting one of a plurality of resonant elements comprises selecting one of a plurality of resonant elements that include at least one mechanically resonant element.

11. The method of claim 10, wherein selecting one of a plurality of resonant elements that include at least one mechanically resonant element comprises selecting one of a plurality of mechanically resonant elements.

12. A method of selecting a transmission frequency for a transmit-only wireless apparatus, comprising:
providing a transmitter having a phase locked loop that has a plurality of selectable output frequencies;
selecting one of the plurality of selectable output frequencies to provide a selected frequency; and
using the selected frequency as the transmission frequency for the transmit-only wireless apparatus;
wherein:
providing a transmitter having a phase locked loop that has a plurality of selectable output frequencies comprises providing a transmitter having a phase locked loop having a PLL control input;
selecting one of the plurality of selectable output frequencies to provide a selected frequency comprises selecting one of a plurality of oscillators; and
selecting one of a plurality of oscillators comprises selecting one of a plurality of oscillators wherein each of the plurality of oscillators has a different mechanically resonant element.

* * * * *

UNITED STATES PATENT AND TRADEMARK OFFICE
CERTIFICATE OF CORRECTION

PATENT NO. : 7,610,030 B2 Page 1 of 1
APPLICATION NO. : 11/555024
DATED : October 27, 2009
INVENTOR(S) : James J. Fitzgibbon, Robert Roy Keller, Jr. and Bernard J. Wojciak It is certified that error appears in the above-identified patent and that said Letters Patent is hereby corrected as shown below:

Column 8, Line 23, Claim 9: Change "a" to -- at --.

Signed and Sealed this

Twenty-third Day of February, 2010

David J. Kappos
*Director of the United States Patent and Trademark Office*